(12) United States Patent
Lin et al.

(10) Patent No.: US 6,420,267 B1
(45) Date of Patent: Jul. 16, 2002

(54) METHOD FOR FORMING AN INTEGRATED BARRIER/PLUG FOR A STACKED CAPACITOR

(75) Inventors: Chenting Lin, Poughkeepsie; Ronald J. Schutz, Millbrook; Andreas Knorr, Fishkill; Keith Wong, Wappingers Falls, all of NY (US); Hua Shen, San Francisco, CA (US); Jenny Lian, Walkkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/551,757

(22) Filed: Apr. 18, 2000

(51) Int. Cl.$^7$ ................................................ H01L 21/00
(52) U.S. Cl. ........................... 438/692; 216/38; 216/88; 438/742; 438/754

(58) Field of Search .................................. 438/690, 691, 438/692, 693, 720, 742–754, 626, 627, 629, 631, 633, 645; 216/6, 38, 75, 76, 88, 89, 100, 101

(56) References Cited

U.S. PATENT DOCUMENTS 5,366,920 A * 11/1994 Yamamichi et al. ........ 216/6 X
6,121,146 A * 9/2000 Yoon et al. ............. 438/745 X

* cited by examiner

*Primary Examiner*—William A. Powell
(74) *Attorney, Agent, or Firm*—Stanton Braden

(57) ABSTRACT

A method of forming an integrated barrier/contact for stacked capacitors is provided which results in reduced cost of ownership and in a barrier which is nominally several times thicker than convention structures. The resulting structure results in decreased contact plug resistance as compared with conventional devices.

8 Claims, 7 Drawing Sheets

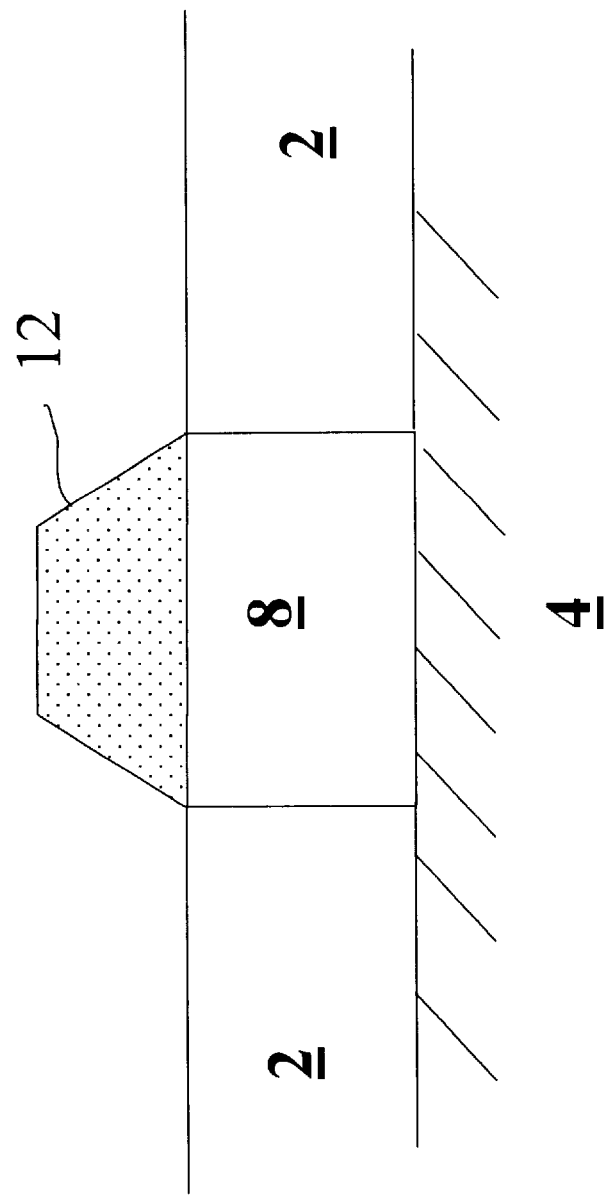

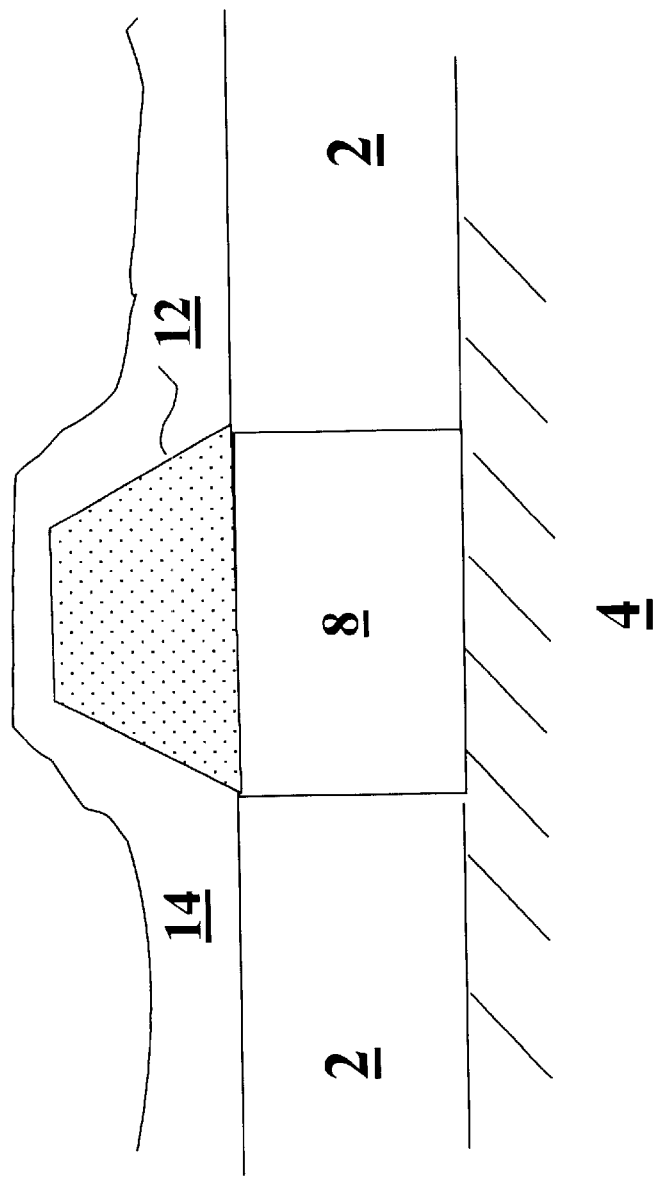

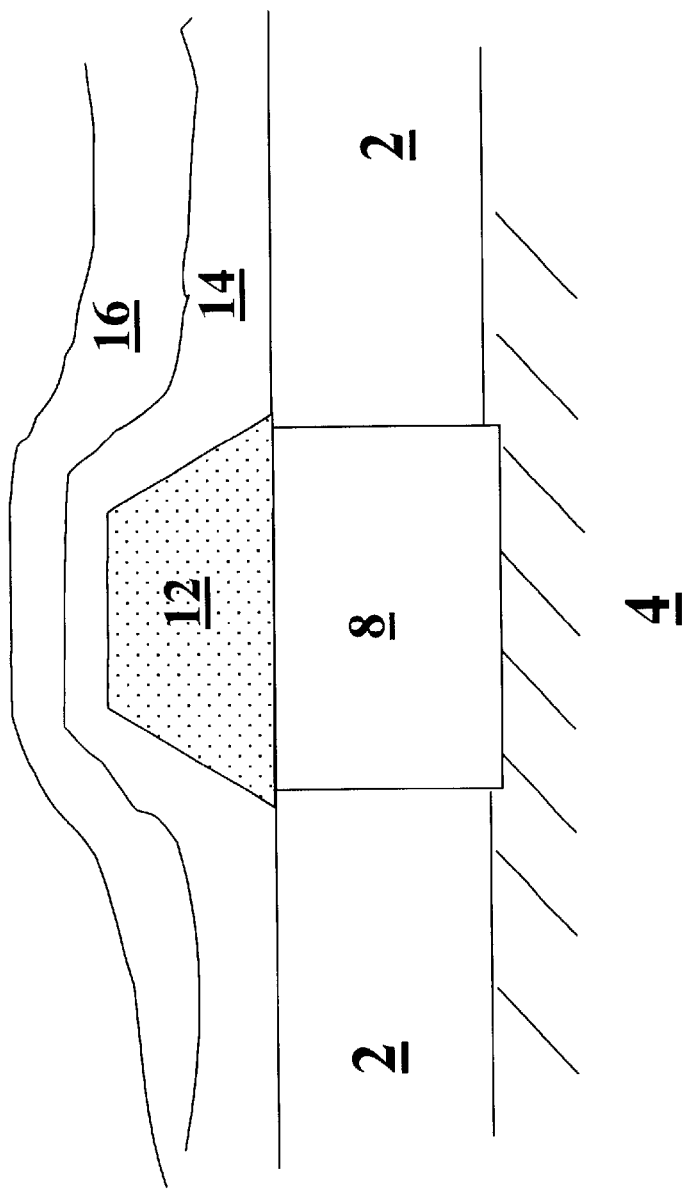

METHOD FOR FORMING AN INTEGRATED BARRIER/PLUG FOR A STACKED CAPACITOR

BACKGROUND OF THE INVENTION

A dynamic random access memory (DRAM) cell is implemented using a number of memory cells formed as part of a large array in a semiconductor chip. The memory cells typically comprise a storage capacitor in combination with an access transistor. A stacked DRAM cell is formed by a stacked capacitor structure which lies on the surface of a semiconductor. An underlying drain/source region from an access transistor is coupled to the stacked transistor's bottom electrode by a conductive plug which extends from the bottom electrode to an underlying drain/source region of the access transistor.

Typically, the conductive plug is separated from the bottom electrode by a diffusion barrier. For instance, U.S. Pat. No. 5,825,609 (hereinafter referred to as '609) to Andricacos et al. discloses such a structure at column 6, lines 58–60. This patent also describes a number of layered electrode structures generally connected together by conductive sidewall coatings. Andriacacos further discloses that the conductive plug structure can be entirely filled with one or more barrier materials. However, the complexity of the layered and conductive sidewall-coated structures generally are not well suited for small capacitors which are associated with 1 gigabit or higher memories.

BRIEF DESCRIPTION OF THE DRAWINGS

FIGS. 1 through 7 are cross-sectional drawings illustrating the process of forming a stacked capacitor cell according to the invention as described below. Reference numerals are carried forward.

DETAILED DESCRIPTION OF THE INVENTION

Figure 1:
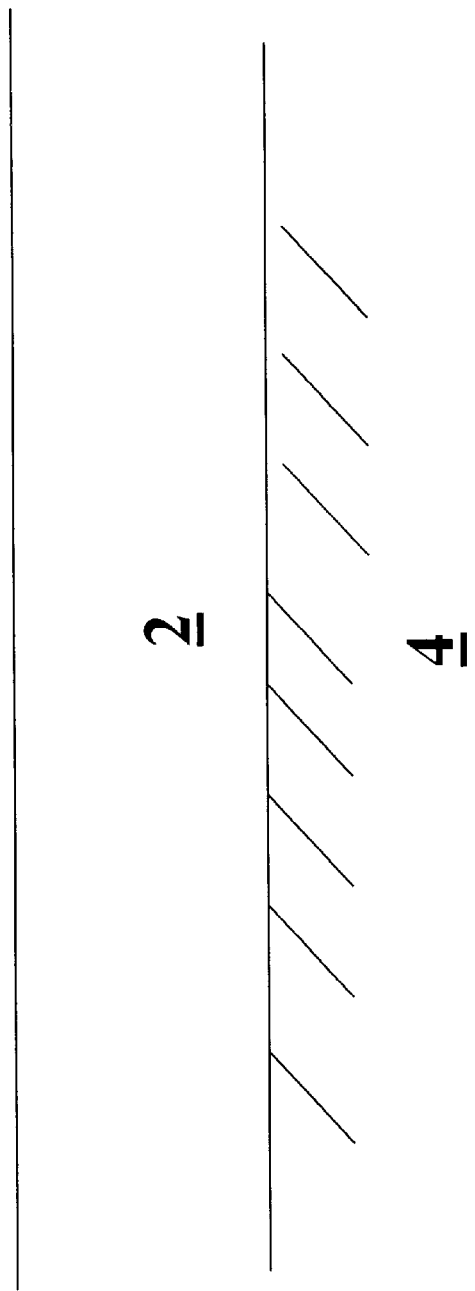

The invention provides a method whereby an improved stacked capacitor results therefrom. With reference to FIG. 1, dielectric 2 such as an oxide is formed on a single crystalline substrate such as single crystalline silicon 4.

Figure 2:
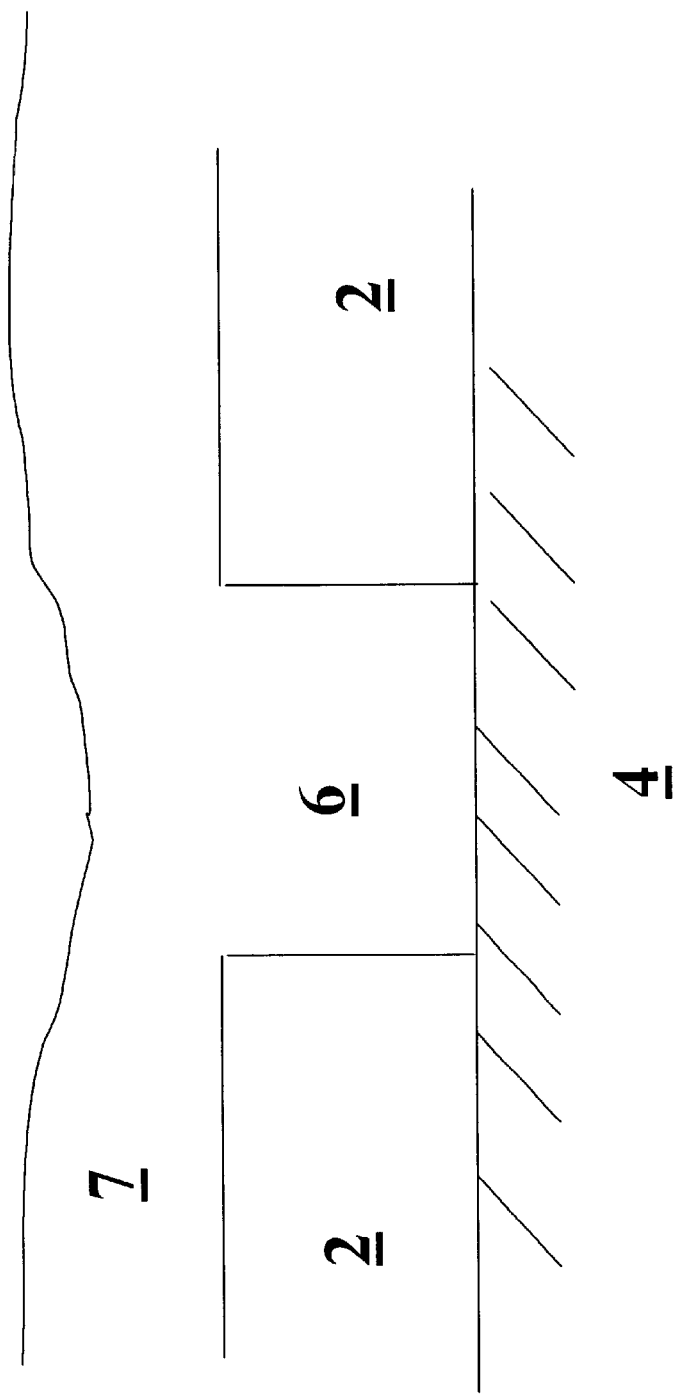

As shown in the resulting structure of FIG. 2, which illustrates a cross-sectional view of the in-process memory cell, dielectric 2 is patterned and etched using conventional etchants and lithographic methods to form contact plug area 6 through dielectric 2 down to substrate 4. Conductive material 7 such as titanium nitride (TiN), tungsten nitride, titanium aluminum nitride, tantalum silicon nitride ($Ta_{1-x}Si_xN_y$, with $0<x<1$ and $y>1$), or other materials having the property of being a barrier to oxygen diffusion as well as to adjacent material, is used to fill contact plug area 6 thereby providing a conductive plug and a diffusion barrier between materials from substrate 4 and adjacent areas including stacked layers adjacent the plug/diffusion barrier. An integrated plug and barrier 8 (referred to hereinafter as barrier/plug 8) is thereby provided in a single step. Preferably, this conductive material is deposited using a chemical vapor deposition (CVD) process.

Figure 3:
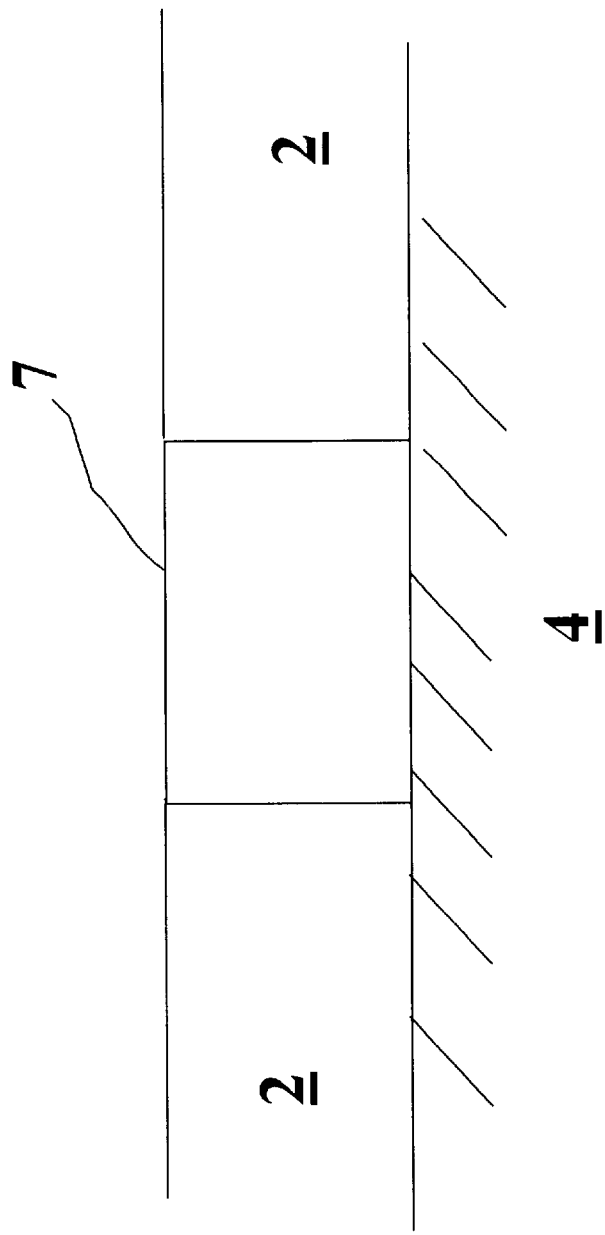

With reference to FIG. 3, which illustrates a cross-section of the capacitor cell undergoing processing, the barrier/plug material is planarized by a method of CMP or other conventional planarization methods.

Figure 4:
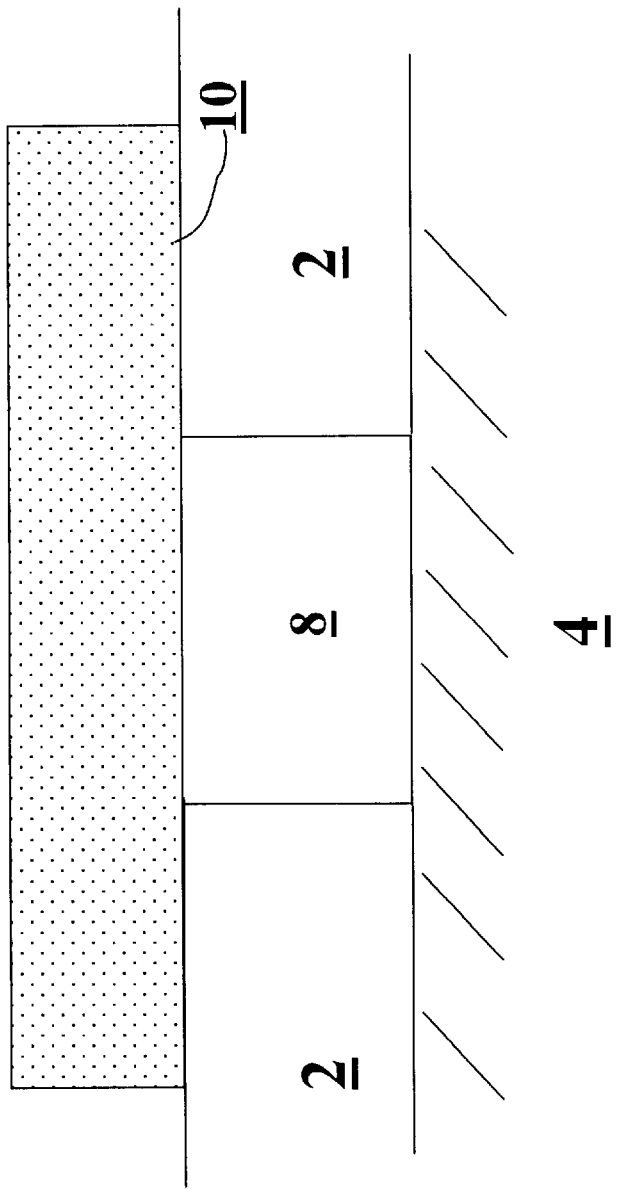

Material 10 for a bottom electrode is placed over barrier/plug 8, preferably by a method of deposition as shown in the cross-sectional drawing of FIG. 4. The bottom electrode is preferably formed of Platinum (Pt). However, other materials can be used for material 10 such as those selected for the groups consisting of noble metals (e.g. Au, Pt, PD, Ir, and Rh), alloys of noble metals with noble or non-noble metals, metals whose oxides are conducting (such as Ru and Mo) electrically conducting oxides (e.g. $RuO_2$, $IrO_2$, and $Re_2O_3$, etc.), electrically conductive, oxidation-resistant nitrides (e.g. TaN, TaSiN) and electrically conductive materials whose oxides can be insulating such as Ti, Al, TiN, W, WN, doped polysilicon, etc.

With reference to FIG. 5, which illustrates a cross-section of the processedmemory cell, the electrode material is patterned and etched by conventional methods to form bottom electrode 12 as shown.

With reference to FIG. 6, dielectric 14, which serves as the capacitor cell dielectric, is preferably BSTO (barium strontium titanate oxide) and alternatively selected from materials such as, paraelectrics, perovskites, pyrochlores, relaxors, layered perovskites,ferroelectrics, or other dielectric material having a high (e.g.>18) dielectric constant. Dielectric 14 is deposited over all as illustrated in the cross-sectional drawing of FIG. 6. Other suitable dielectrics include, $TA_2O_5$, $(Ba,SR)TiO_3$, barium strontium titanate (BST), $BaTiO_3$, $SrTiO_3$, $PbZr_{1-x}$, $Ti_2$, $O_3$ (PZT), $PbZrO_3$, $Pb_{1-x}La_x TiO_3$ (PLT), $Pb_{1-x}La_x(Zr_yTi_{1-y})_{1-x/z}O_3$(PLZT), and $SrBi_2Ta_2O_9$(SBT). Top electrode 16, which can be formed of the same material as bottom electrode 12, is deposited over dielectric 14 as illustrated in the cross-sectional drawing of FIG. 7, thereby forming the structure of a capacitor comprising two electrically conductive surfaces in spaced apart relation separated by an insulator.

A primary advantage of the invention lies in the fact that the reduced complexity of the process, in relation to prior art processes, is better suited for obtaining improved functionality and process yield for highly integrated, dimensionally smaller devices.

A further advantage of the invention is that the single material plug structure is a better diffusion barrier as compared with structures wherein a barrier abuts a conductor such as polysilicon. Diffusion barrier effectiveness is governed to an extent by thickness and the barrier to diffusion provided by the invention's conductive barrier material is more effective than a non-conductive barrier and conductor which occupy comparable space.

Another advantage of the invention is provided through plug material which is much more conductive than polysilicon; a material typically used for plugs. Consequently, the foregoing invention provides a method which results in decreased contact plug resistance as compared with conventional methods leading to for instance, a poly plug.

The foregoing invention is especially well suited for use in forming the storage capacitor of a memory cell in a dynamic random access memory (DRAM).

Although the invention has been described in detail herein with reference to the preferred embodiments and certain described alternatives, it is to be understood that this description is by way of example only, and it is not to be construed in a limiting sense. It is to be further understood that numerous changes in the details of the embodiments of the invention and additional embodiments of the invention, will be apparent to, and may be made by, persons of ordinary skill in the art having reference to this description. For instance, the substrate on which the capacitor is formed may be silicon or any other known semiconductor such as, gallium arsenide, indium, germanium, or diamond. It is contemplated that all such changes and additional embodiments are within the spirit and true scope of the invention as claimed below.

We claim:

1. A process for forming an integrated barrier/plug memory cell structure comprising:

etching a area in a semiconductor substrate;

depositing a conductive barrier/plug material within said etched area, said conductive plug material being selected from the group consisting of titanium nitride, tungsten nitride, titanium aluminum nitride, tantalum silicon nitride, or a combination thereof;

planarizing said deposited conductive plug material;

depositing a first conductor selected from the group consisting of platinum, the noble metals, alloys of noble metals, alloys of noble metals with noble or nonnoble metals, metals whose oxides are conducting, electrically conducting oxides, electrically conductive-oxidation-resistant nitrides and electrically conductive materials whose oxides are insulating;

patterning and etching said deposited first conductor;

depositing a high dielectric constant material over said patterned and etched first conductor; and depositing a second conductor on said deposited high dielectric constant material.

2. A process,for forming an integrated barrier/plug memory cell structure as recited in claim 1 wherein said second conductor consists of titanium nitride, tungsten nitride, titanium aluminum nitride, tantalum silicon nitride, or a combination thereof.

3. A process for forming an integrated barrier/plug memory cell structure as recited in claim 1, wherein said high dielectric material is selected from the group consisting of BSTO, paraelectrics, perovskites, pyrochlores, relaxors, layered perovskites, ferroelectrics, $TA_2O_5$, $(Ba,SR)TiO_3$, barium strontium titanate, $BaTiO_2$, $SrTiO_3$, PZT, $PbZrO_3$, PLT, PLZT, $SrBi_2Ta_2O_3$, or a combination thereof.

4. A process for forming an integrated barrier/plug memory cell structure as recited in claim 1, wherein said high dielectric material is selected from dielectric material with a dielectric constant of greater than 18.

5. A process for forming an integrated barrier/plug memory cell structure as recited in claim 1, wherein said conductive barrier/plug material is planarized using a method of chemical mechanical polishing.

6. A process for forming an integrated barrier/plug memory cell structure as recited in claim 1 wherein said depositing steps are accomplished using chemical vapor deposition.

7. A process for forming an integrated barrier/plug memory cell structure as recited in claim 1 wherein said substrate comprises silicon, gallium arsenide, indium, germanium, or diamond.

8. A process for forming an integrated barrier/plug memory cell structure as recited in claim 1, wherein said high dielectric material is selected from the group consisting of barium strontium titanate oxide, paraelectrics, perovskites, pyrochlores, relaxors, layered perovskites, ferroelectrics, or other dielectric material having a dielectric constant of greater than 18.

* * * * *